US011435002B1

(12) United States Patent
Shea et al.

(10) Patent No.: US 11,435,002 B1
(45) Date of Patent: Sep. 6, 2022

(54) ACTUATOR, VALVE ACTUATOR UNIT AND VALVE

(71) Applicants: Bürkert Werke GmbH & Co. KG, Ingelfingen (DE); ECOLE POLYTECHNIQUE FEDERALE DE LAUSANNE (EPFL), Lausanne (CH)

(72) Inventors: Herbert Rudolf Shea, Lausanne (CH); Fabio Beco Albuquerque, Lausanne (CH)

(73) Assignees: Bürkert Werke GmbH & Co. KG, Ingelfingen (DE); ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 17/245,304

(22) Filed: Apr. 30, 2021

(51) Int. Cl.
*F16K 31/00* (2006.01)
*F16K 7/14* (2006.01)
*H02N 1/00* (2006.01)

(52) U.S. Cl.
CPC .............. *F16K 7/14* (2013.01); *F16K 31/007* (2013.01); *H02N 1/006* (2013.01)

(58) Field of Classification Search
CPC ... F16K 7/12; F16K 7/126; F16K 7/14; F16K 31/004; F16K 31/005; F16K 31/007; F16K 41/10; F16K 41/103; F16K 41/106; F16K 41/12; F16K 41/125; F16K 99/0048; H02N 1/006
See application file for complete search history.

(56) References Cited

U.S. PATENT DOCUMENTS

| | | | | |
|---|---|---|---|---|
| 6,062,256 A * | 5/2000 | Miller | ................... | H01L 41/094 137/487.5 |
| 6,065,688 A * | 5/2000 | Wilson | ................... | F16K 31/004 239/99 |
| 2002/0117517 A1 * | 8/2002 | Unger | ................. | F16K 99/0017 222/214 |
| 2005/0133751 A1 * | 6/2005 | Seeley | .................. | F16K 31/005 251/129.06 |

* cited by examiner

Primary Examiner — Hailey K. Do
(74) Attorney, Agent, or Firm — McNees Wallace & Nurick LLC

(57) ABSTRACT

An actuator (22) comprises at least one actuator body (32) of dielectric elastomeric material and two electrodes (34, 36) being attached to opposite surfaces of the actuator body (32), respectively. At least one of the actuator body (32) and at least one of the electrodes (34, 36) is at least partly covered at its outer side with a protective layer (38a, 38b) of polymer material, wherein a mechanical stiffness of the protective layer (38a, 38b) is at least three times lower than a mechanical stiffness of the actuator body (32). Moreover, a valve actuator unit comprises such an actuator (22) and a housing, wherein the actuator (22) is arranged within the housing and the remainder of the housing is filled with a gas. Additionally, a valve comprises such a valve actuator unit and a valve element, wherein the valve element is movable by the valve actuator unit.

15 Claims, 4 Drawing Sheets

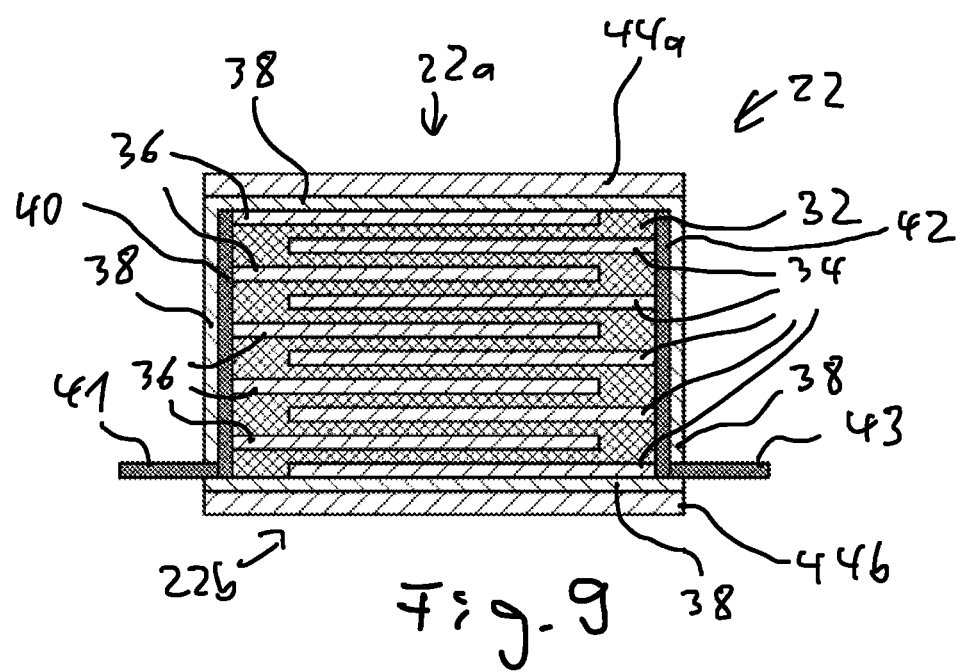

ACTUATOR, VALVE ACTUATOR UNIT AND VALVE

FIELD OF THE INVENTION

The invention relates to an actuator comprising at least one actuator body of dielectric elastomeric material and two electrodes being attached to opposite surfaces of the actuator body, respectively.

The invention is additionally directed to a valve actuator unit comprising such an actuator.

Moreover, the invention relates to a valve comprising a valve actuator unit of the type mentioned above and a valve element, wherein the valve element is movable by the valve actuator unit.

BACKGROUND

Such actuators as well as valve actuator units and valves equipped therewith are known in the art.

Due to the material of the actuator body such actuators are often called Dielectric Elastomer Actuators (DEA).

Dielectric Elastomer Actuators are able to convert electrical energy into mechanical work. To this end, a voltage is applied between the electrodes and, depending on the voltage, the actuator body is compressed between the electrodes in a defined manner leading to an elongation of the actuator body since the actuator body substantially keeps its volume constant.

Such actuators are used in a great variety of applications, for example in valve actuator units.

The objective of the present invention is to improve such actuators, especially with a view to an enhanced service life and increased reliability.

SUMMARY OF THE INVENTION

The present invention provides an actuator comprising at least one actuator body of dielectric elastomeric material and two electrodes being attached to opposite surfaces of the actuator body, respectively. At least one of the actuator body and at least one of the electrodes is at least partly covered at its outer side with a protective layer of polymer material. A mechanical stiffness of the protective layer is at least three times lower than a mechanical stiffness of the actuator body. Thus, either one electrode is at least partly covered with a protective layer or both electrodes are at least partly covered with a protective layer or the actuator body is at least partly covered with a protective layer. Also combinations of these alternatives are possible. The stiffness of the protective layer is very low as compared to the mechanical stiffness of the actuator body. Consequently, the protective layer has a very little, in particular negligible, effect on the mechanical properties of the actuator body. This especially means that the protective layer does not hinder the deformation of the actuator body due to the application of a voltage to the electrodes. As a result of this configuration, the actuator can be operated in an efficient and reliable manner. Further, its service life is increased.

According to one option, the stiffness of the protective layer is at least five times, in particular at least ten times, lower than the mechanical stiffness of the actuator body. Thus, the effect of the protective layer on the mechanical properties of the actuator body is especially low.

The protective layer may comprise a material which acts as an adhesive when brought in contact with the actuator body. Consequently, the protective layer is held on the actuator body by adhesive forces. This is structurally simple since no additional elements or materials are necessary for fixing the protective layer to the actuator body. Furthermore, adhesive forces are long-lasting. This has a positive effect on the service life of the actuator.

Preferably, the protective layer is 0.5 µm to 5 µm thick. In an example, the protective layer is 3 µm to 4 µm thick. In other words, the protective layer is very thin. For this reason, only a very small amount of polymer material is needed. Moreover, such a thin layer does only have very minor effects on the operational characteristics of the actuator. Ideally, the operational characteristics are not altered by the protective layer.

In the present context, the actuator body may have the form of one of a sheet, a strip and a foil, wherein one of the electrodes is attached to an upper surface of the actuator body and the other electrode is attached to a lower surface of the actuator body. Preferably, the electrodes are positioned directly opposite each other. This leads to a very efficient conversion of electrical energy into mechanical work.

If the actuator body has the form of a foil, the actuator may also be referred to as a foil actuator or film actuator.

If the actuator body has the form of a strip, the actuator may also be designated as an actuator strip or strip actuator.

The protective layer may comprise a hydrophobic polymer material. In the present context hydrophobic designates the property of a material to seemingly repel water spilt thereon. Strictly speaking the repulsion of water is due to the absence of attraction forces between water and the material. This property of the protective layer substantially increases the service life of the actuator, especially in humid environments. It is noted that for the present invention a humid environment is to be understood as a gaseous environment which contains humidity. In particular, the environment is ambient air comprising a certain amount of humidity. Thus, the actuator is not arranged in a liquid.

Preferably, a young's modulus of the protective layer is 1 MPa or lower. Such a protective layer has a particularly low mechanical effect on the actuator body and does practically not affect its deformation capabilities.

Moreover, the protective layer may be a passivation layer. This means that the protective layer shields at least one of the electrodes and/or the actuator body at least partly from potential chemical reactions with an environment, e.g. corrosion. Also electrochemical degradation of the electrodes and/or the actuator body may be reduced. The same applies to surface arcing. This leads to an enhanced service life and good reliability of the actuator.

The protective layer may also be an electrical insulator. Thus, the electrodes are at least partially isolated with respect to their environment. Consequently, the actuator may be safely operated. In this context it is clear that areas of the electrodes used for electrical connections need to be left free from such an electrical insulator.

According to a variant, at least one electrode is fully covered by the protective layer. Preferably, both electrodes are fully covered by the protective layer. This leads to a very reliable protection of the respective electrode from humidity and chemical reactions with the environment. Of course, an interface between the electrode and the actuator body is free from material of the protective layer. Only an outer side of the respective electrode is fully covered by the protective layer.

It is also possible that the at least one electrode and a surface region of the actuator body adjacent to the electrode are fully covered by the protective layer. Thus, the protective layer fully covers the electrode and neighboring portions of the actuator body. This further increases the reliability of the protection of the electrode from ambient humidity or chemical reactions with the environment.

Furthermore, more than one surface of the actuator body may be at least partly covered by the protective layer. Thus, the actuator body is protected from influences of its environment, e.g. humidity, in an especially reliable manner.

In particular, all surfaces of the actuator body may at least partly be covered by the protective layer. Also in this case, the actuator body is well protected from undesired influences of the environment.

In a special case all electrodes and all surfaces of the actuator body can be fully covered by the protective layer. In other words, the actuator is fully covered or coated with the protective layer. Such an actuator is especially robust with respect to influences of its environment.

The actuator may also comprise more than one actuator body wherein the actuator bodies are arranged in layers. Thus, the actuator may be a multi-layer actuator. As compared to a single-layer actuator such an actuator is suitable for providing higher actuator forces.

Preferably, the protective layer comprises a thermoplastic elastomer material or a silicone material or an acrylic material. The thermoplastic elastomer material is for example a styrene-ethylene-butylene-styrene block copolymer material. The silicone material is for example a polydimethylsiloxane material. Styrene-ethylene-butylene-styrene block copolymer material may be abbreviated as SEBS. Polydimethylsiloxane material may be abbreviated as PDMS. All of the above materials are suitable for enhancing the service life of an actuator according to the invention. Moreover, the materials may be applied to a surface of an electrode and/or an actuator body in a simple manner. To this end a solution for example comprising SEBS or PDMS respectively may be applied to the respective surfaces. After the corresponding solvent has evaporated, the surfaces are reliably coated.

Methods for applying the protective layer on the electrode and/or the actuator body comprise lamination techniques, inkjet printing techniques, pouring techniques, evaporation techniques, spraying techniques, and spin coating techniques. Of course, also combinations of these techniques are possible. The appropriate technique is selected depending on the specific application. In this context, the protective layer may be applied to the actuator body in a pre-stretched condition. However, this is just an option.

According to an embodiment, the actuator is a valve actuator. This means that the actuator is specifically adapted for operating a valve element.

The problem is additionally solved by a valve actuator unit comprising an actuator according to the invention and a housing, wherein the actuator is arranged within the housing and the remainder of the housing is filled with a gas. The gas is in particular ambient air. Such a valve actuator unit has a long service life and is reliable in operation.

Moreover, the present invention provides a valve comprising a valve actuator unit according to the invention and a valve element, wherein the valve element is movable by the valve actuator unit. Such a valve offers a very reliable performance and has a long service life.

Beyond that, the effects and advantages, which have been explained in connection with the actuator according to the invention, also apply to the valve actuator unit according to the invention and the valve according to the invention and vice versa.

For the purposes of the present disclosure, the phrase "at least one of A and B", for example, means (A), (B), or (A and B), including all further possible permutations when more than two elements are listed. In other words, the term "at least one of A and B" is a synonym of "A and/or B", namely "A" alone, "B" alone, or "A and B".

BRIEF DESCRIPTION OF THE DRAWINGS

FIG. 9 shows the actuator of FIG. 8 in a sectional view along plane IX in FIG. 8.

DETAILED DESCRIPTION

Figure 1:
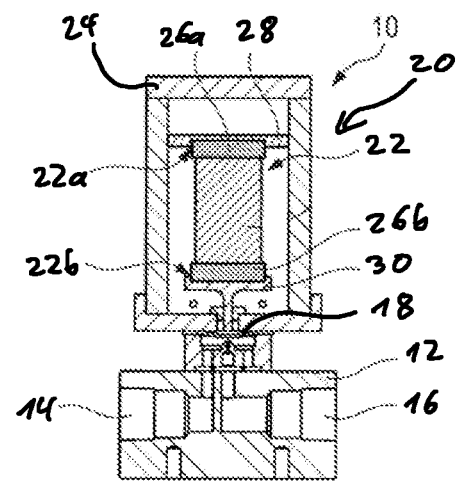
FIG. 1 shows a valve according to the invention comprising a valve actuator unit according to the invention having an actuator according to a first embodiment of the invention.

FIG. 1 shows a valve 10 comprising a valve block 12 having a fluid inlet port 14 and a fluid outlet port 16.

The fluid inlet port 14 and the fluid outlet port 16 may be selectively fluidically connected or separated by moving a valve element 18 from a connection position into a separation position and vice versa.

In the example shown in FIG. 1, the valve element 18 is a diaphragm.

The valve 10 comprises a valve actuator unit 20 for moving the valve element 18 against a valve seat to close the valve.

The valve actuator unit 20 comprises an actuator 22 according to a first embodiment which is a valve actuator.

The actuator 22 is arranged in a housing 24.

The housing 24 is generally filled with ambient air, i.e. all portions of the housing 24 which are not occupied by the actuator 22 or other elements of the valve actuator unit 20 are occupied by ambient air.

A first end 22a of the actuator 22 is mounted on the housing 24 via a first mounting interface 26a and a holding bar 28.

A second end 22b of the actuator 22 which is opposed to the first end 22a thereof is operatively coupled to the valve element 18 via a second mounting interface 26b and a coupling member 30.

Figure 2:
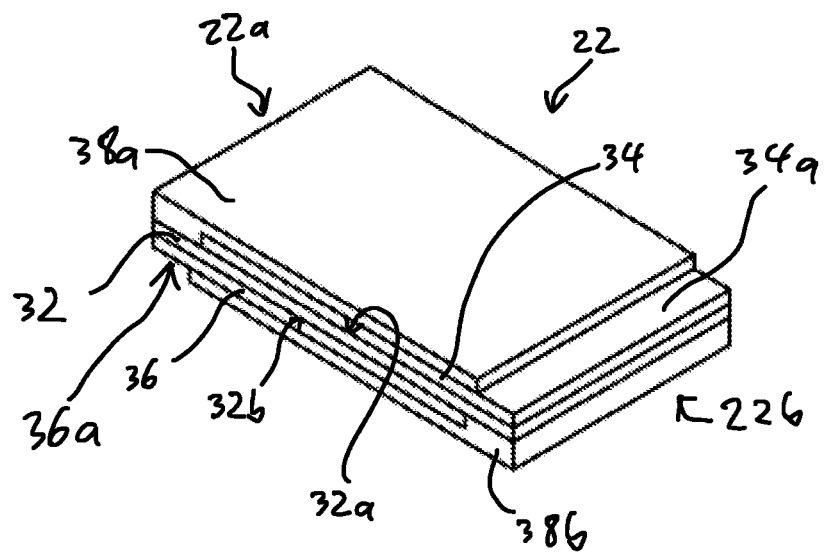
FIG. 2 shows the actuator of FIG. 1 in a separate, perspective representation.
Figure 3:
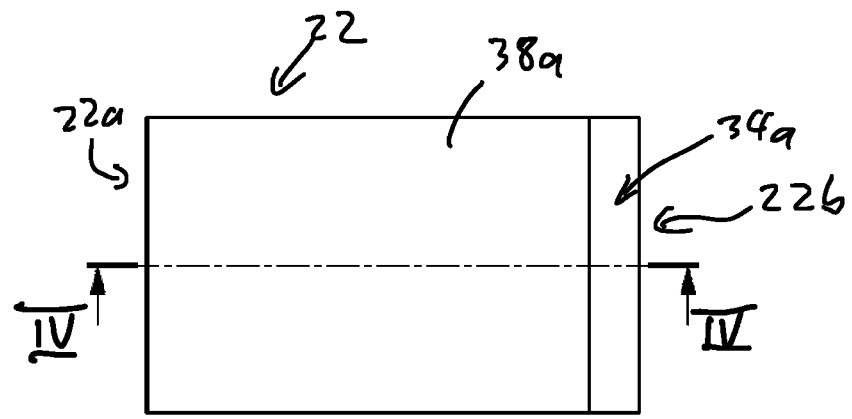
FIG. 3 shows a top view of the actuator of FIG. 2.
Figure 4:
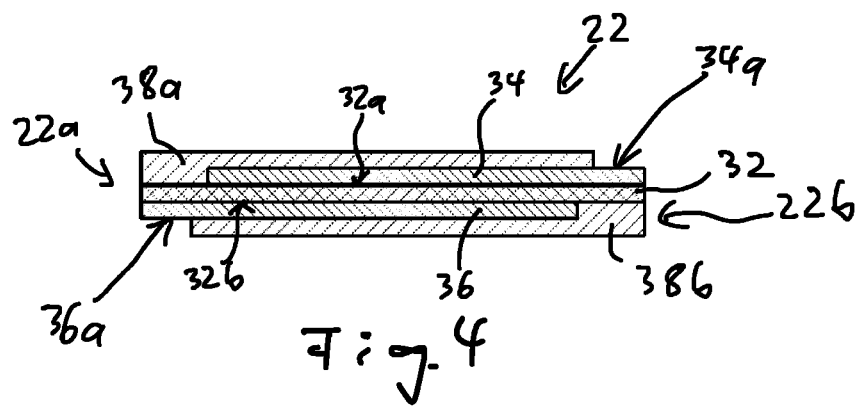
FIG. 4 shows the actuator of FIGS. 2 and 3 in a sectional view along line IV-IV in FIG. 3.

FIGS. 2 to 4 show the actuator 22 in more detail.

The actuator 22 comprises an actuator body 32 which is made of a dielectric elastomeric material.

In the example shown the actuator body 32 has the form of a strip. It comprises an upper surface 32a and a lower surface 32b.

A first electrode 34 is attached immediately to the upper surface 32a of the actuator body 32 and a second electrode 36 is immediately attached to the lower surface 32b of the actuator body (see especially FIG. 4).

Both electrodes 34, 36 are also of a substantially rectangular form, i.e. also the electrodes 34, 36 are formed as strips.

Each of the electrodes 34, 36 has an electrical connection surface 34a, 36a for providing a voltage to the respective electrode 34, 36.

A portion of the first electrode 34 and a portion of the upper surface 32a of the actuator body 32 are covered with a first protective layer 38a of polymer material.

The first protective layer 38a is arranged such that the connection surface 34a is not covered with the first protective layer 38a. Otherwise, an electrical connection to an external voltage source would be hindered.

The same applies to the lower surface 32b of the actuator body 32, i.e. a portion of the second electrode 36 and a portion of the lower surface 32b of the actuator body 32 are covered with a second protective layer 38b of polymer material.

Also the second protective layer 38b is arranged such that the connection surface 36a is not covered by the second protective layer 38b. Otherwise, an electrical connection to an external voltage source would not be possible.

In other words, the electrodes 34, 36 and a corresponding surface region of the actuator body 32, which is adjacent to the respective electrode 34, 36 are covered by the protective layers 38a, 38b.

As far as the actuator body 32 is concerned, its upper surface 32a and its lower surface 32b are fully covered, either directly by the corresponding protective layer 38a, 38b or by one of the electrodes 34, 36.

In the present example both protective layers 38a, 38b are made either from a styrene-ethylene-butylene-styrene block copolymer material or from a polydimethylsiloxane material. These materials are alternatives.

Both of these materials are hydrophobic polymer materials.

Moreover, a young's modulus of both of these materials is lower than 1 MPa.

As far as the mechanical stiffness of the protective layers 38a, 38b is concerned, it is approximately ten times lower than the mechanical stiffness of the actuator body 32.

The protective layers 38a, 38b also serve as passivation layers, i.e. they protect the corresponding electrodes 34, 36 and the corresponding portions of the actuator body 32 from undesired chemical reactions with the environment and additionally prevent undesired arcing.

Furthermore, the protective layers 38a, 38b are electrical insulators.

Figure 5:
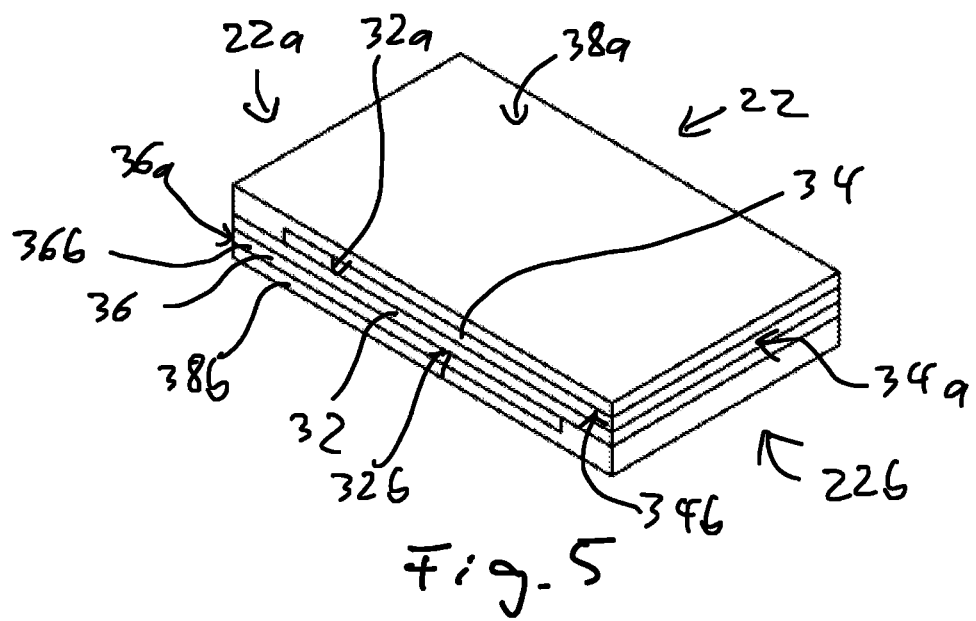
FIG. 5 shows an actuator according to a second embodiment in a separate, perspective representation.
Figure 6:
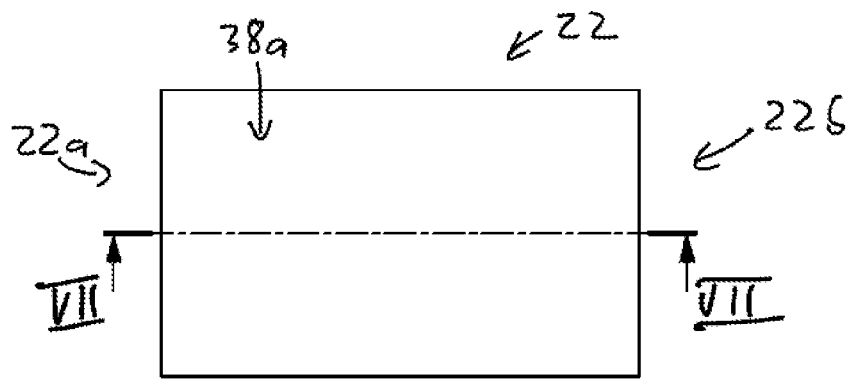
FIG. 6 shows a top view of the actuator of FIG. 5.
Figure 7:
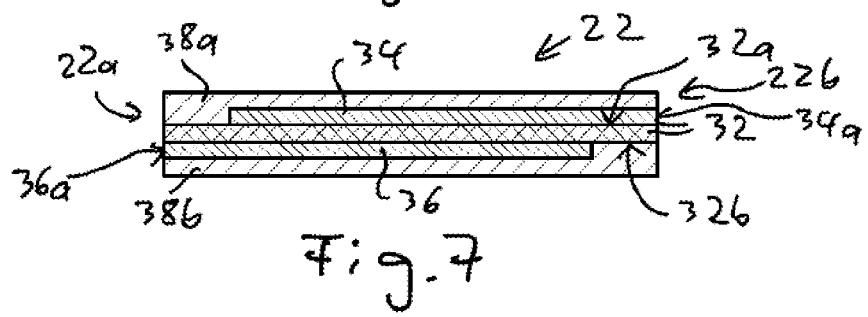
FIG. 7 shows the actuator of FIGS. 5 and 6 in a sectional view along line VII-VII in FIG. 6.

FIGS. 5 to 7 show a second embodiment of the actuator 22.

The actuator 22 according to the second embodiment is suitable for replacing the actuator 22 according to the first embodiment in the valve actuator unit 20 of the valve 10 as shown in FIG. 1.

In the following, only the differences between the actuator 22 of the first embodiment and the second embodiment will be explained.

In the second embodiment, the protective layers 38a, 38b fully cover the sides of the actuator 22 corresponding to the upper surface 32a and the lower surface 32b of the actuator body 32.

For this reason, the connection surfaces 34a, 36a are provided on the end faces of the corresponding electrodes 34, 36 facing the respective end 22a, 22b of the actuator (see especially FIGS. 5 and 7).

In an alternative, the connection surface 34b, 36b are arranged on lateral side faces of the corresponding electrodes (see FIG. 5).

The actuator 22 according to the first and second embodiments is a single-layer actuator. However, it is also possible that the actuator 22 comprises more than one actuator body 32 and the actuator bodies 32 are arranged in layers. Thus, the actuator 22 can also be a multi-layer actuator.

Figure 8:
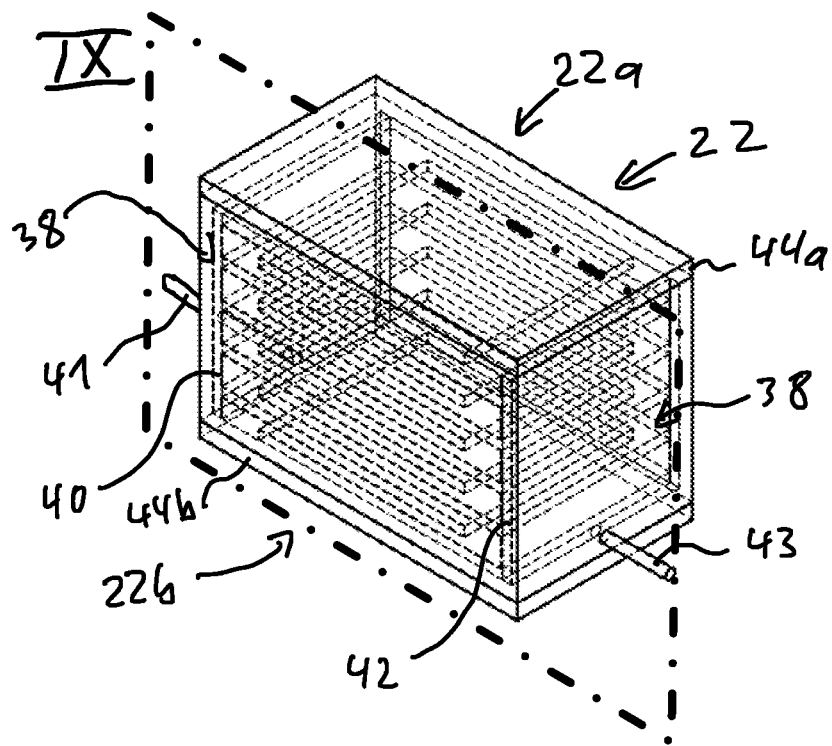
FIG. 8 shows an actuator according to a third embodiment in a separate, perspective representation.

FIGS. 8 and 9 show an actuator 22 according to a third embodiment, which is a multi-layer actuator or stack actuator.

The actuator 22 according to the third embodiment is also suitable for replacing the actuator 22 according to the first embodiment in the valve actuator unit 20 of the valve 10 as shown in FIG. 1.

In the following, the actuator 22 according to the third embodiment will be explained by only referring to the differences with respect to the first and second embodiments.

The exemplary actuator 22 comprises a total of five electrodes 36 being electrically connected to a first connection means 40 being substantially plate-shaped.

The first connection means 40 is electrically connected to a wire 41 which can be connected to a voltage source.

Moreover, a total of five electrodes 34 is provided. These electrodes are electrically connected to a second connection means 42 which is also substantially plate-shaped.

The second connection means 42 is electrically connected to a wire 43 which can be connected to a voltage source.

In the example shown in the Figures, the connection means 40, 42 are arranged on opposite sides of the actuator 22. However, depending on the specific application, it is also possible to arrange the connection means 40, 42 on adjacent sides, e.g. one of the connection means 40, 42 and the corresponding wire 41, 43 could be moved to the front side or the back side of the actuator 22 as shown in FIG. 8.

The actuator body 32 now comprises a plurality of layers wherein each layer is interposed between one of the electrodes 34 and a neighboring one of the electrodes 36.

Moreover, a first stabilization plate 44a is provided at the first end 22a of the actuator 22 and a second stabilization plate 44b is provided at the second end 22b of the actuator.

When being used in the valve 10 the first stabilization plate 44a constitutes the first mounting interface 26a and the second stabilization plate 44b constitutes the second mounting interface 26b.

This means that with respect to the actuator according to the first and second embodiments the electrodes 34, 36 and the actuator body 32 are used in an orientation substantially turned by 90 degrees.

Furthermore, the actuator 22 according to the third embodiment comprises protective layers, now generally designated by reference sign 38, on all sides.

This means that also the connection means 40, 42 are covered with the protective layers 38, i.e. the connection means 40, 42 are arranged at an inside of the protective layers 38.

The protective layers 38 are interrupted only at the positions where the wires 41, 43 protrude to the outside of the actuator 22. In other words, the electrodes 34, the electrodes 36, the connection means 40, 42 and the actuator body 32 are fully covered by the protective layers 38 except for the fact that the wires 41, 43 penetrate the protective layers 38.

It is further noted that the respective positions at which the wires 41, 43 penetrate the protective layers 38 are of exemplary nature. Depending on the specific application of the actuator 22, the wires 41, 43 can also penetrate the protective layers 38 at different positions.

Moreover, as has been mentioned before, also the number of electrodes 34, 36 can be changed in order to adapt the actuator 22 to different applications.

The invention claimed is:

1. An actuator comprising:
at least one actuator body of dielectric elastomeric material and two electrodes being attached to opposite surfaces of the at least one actuator body respectively, wherein at least one of the at least one actuator body and at least one of the two electrodes is at least partly covered at its outer side with a protective layer of polymer material, wherein a mechanical stiffness of the protective layer is at least three times lower than a mechanical stiffness of the at least one actuator body, wherein the protective layer comprises a polydimethylsiloxane material which acts as an adhesive when brought in contact with the at least one actuator body.

2. The actuator according to claim 1, wherein the at least one actuator body has the form of one of a sheet, a strip and a foil, wherein one of the two electrodes is attached to an upper surface of the at least one actuator body and an other electrode is attached to a lower surface of the at least one actuator body.

3. The actuator according to claim 1, wherein the protective layer comprises a hydrophobic polymer material.

4. The actuator according to claim 1, wherein the protective layer has a young's modulus of 1 MPa or lower.

5. The actuator according to claim 1, wherein the protective layer is a passivation layer.

6. The actuator according to claim 1, wherein the protective layer is an electrical insulator.

7. The actuator according to claim 1, wherein the actuator comprises more than one actuator body and the more than one actuator body are arranged in layers.

8. The actuator according to claim 1, wherein the protective layer comprises a thermoplastic elastomer material or a silicone material or an acrylic material.

9. The actuator according to claim 1, wherein at least one electrode is fully covered by the protective layer.

10. The actuator according to claim 9, wherein the at least one electrode and a surface region of the at least one actuator body adjacent to the at least one electrode are fully covered by the protective layer.

11. The actuator according to claim 1, wherein more than one surface of the at least one actuator body is at least partly covered by the protective layer.

12. The actuator according to claim 11, wherein all surfaces of the at least one actuator body are at least partly covered by the protective layer.

13. The actuator according to claim 1, wherein the actuator is a valve actuator.

14. A valve actuator unit comprising an actuator according to claim 13 and a housing, wherein the actuator is arranged within the housing and the remainder of the housing is filled with a gas.

15. A valve comprising a valve actuator unit according to claim 14 and a valve element, wherein the valve element is movable by the valve actuator unit.

* * * * *